United States Patent [19]
Birx

[11] Patent Number: 4,996,495
[45] Date of Patent: Feb. 26, 1991

[54] METHOD AND APPARATUS FOR GENERATING PULSED RF POWER

[75] Inventor: Daniel L. Birx, Oakley, Calif.

[73] Assignee: Science Research Laboratory, Inc., Somerville, Mass.

[21] Appl. No.: 278,810

[22] Filed: Dec. 2, 1988

[51] Int. Cl.$^5$ ............................................. H03K 3/01
[52] U.S. Cl. .................................. 328/65; 307/261; 307/268; 307/639; 307/106; 328/67
[58] Field of Search ............... 307/261, 638, 639, 268, 307/106; 328/65, 66, 67

[56] References Cited

U.S. PATENT DOCUMENTS

| | | | |
|---|---|---|---|
| 3,134,048 | 5/1964 | Wolfframm et al. | 328/67 |
| 3,388,287 | 6/1968 | Keenan | 328/65 |
| 3,611,210 | 10/1971 | Theodore | 328/67 |
| 3,654,491 | 4/1972 | Earp | 328/67 |
| 4,161,696 | 7/1979 | Dishal et al. | 328/65 |
| 4,491,842 | 1/1985 | Gripshover et al. | 328/67 |

*Primary Examiner*—Stanley D. Miller
*Attorney, Agent, or Firm*—Wolf, Greenfield & Sacks

[57] ABSTRACT

An improved method and apparatus for generating a pulsed RF power signal is provided. A DC pulse signal is generated which is compressed to increase its power to a predetermined level. The compressed pulse signal is applied to rapidly charge capacitive elements of a frozen wave generator. The capacitive elements may for example be lumped capacitors or transmission line segments. The charging step is accomplished in a manner such that the level and/or polarity of the charge for alternate stages are different than the level and/or polarity for the remaining stages. This may be accomplished by initially charging all stages to the same level and polarity and then either flipping the charge for alternate stages or otherwise altering the charge for such alternate stages or by initially charging alternate ones of the stages to a different level and/or polarity than the remaining stages. Once the capacitive elements for all stages of the frozen wave generator are charged to the desired level and/or polarity, the charges are permitted to propagate through the frozen wave generator to the last stage thereof, the desired RF output signal being taken at the output from such last stage.

27 Claims, 3 Drawing Sheets

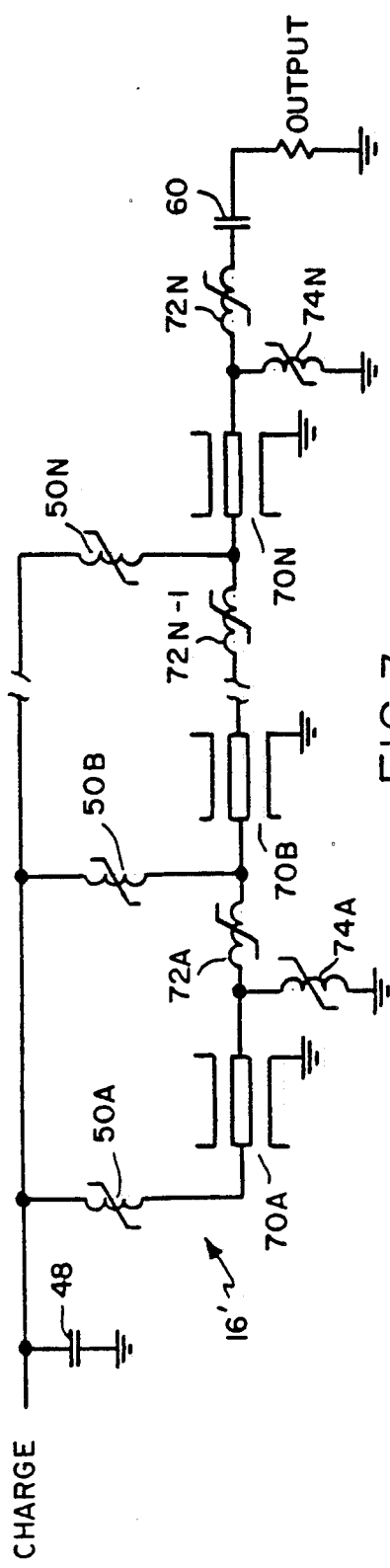
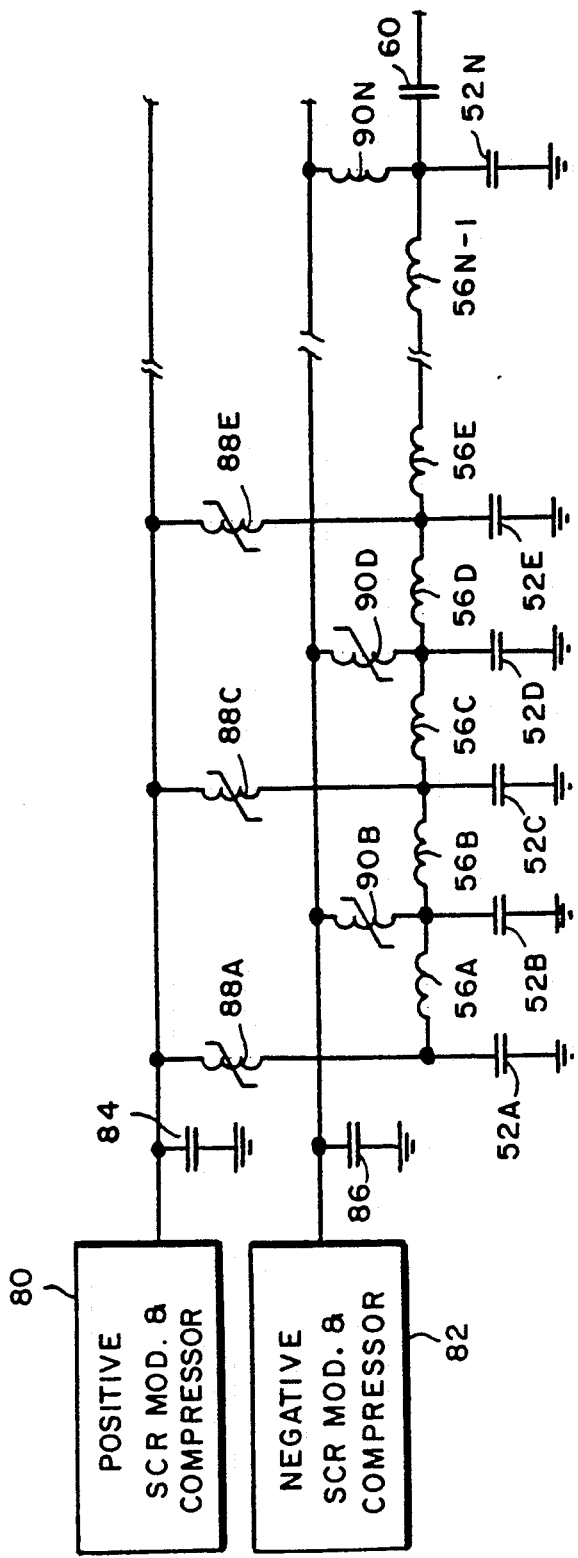
FIG.3
FIG.4

METHOD AND APPARATUS FOR GENERATING PULSED RF POWER

FIELD OF THE INVENTION

This invention relates to a method and apparatus for generating a high power pulsed RF signal and more particularly to a high power pulsed RF source which is substantially smaller, lighter, and less expensive than any existing devices adapted for performing this function.

BACKGROUND OF THE INVENTION

There are many scientific, military and commercial applications where very high voltage and energy pulsed RF signals are required, the output power in some instances being in the megawatt to gigawatt range. Such pulse generators are for example useful in driving discharge lasers, including those used for laser radar, and in driving linear accelerators such as induction linacs. In the laser application for example, when DC electrodes are used to drive the laser head, such electrodes erode in the laser medium changing the breakdown characters of the laser, requiring replacement of the electrodes after only a few hundred hours of use and contaminating the gas of the laser head. Such problems can be overcome if an RF drive is employed, permitting the electrodes to be removed. However, the only RF sources heretofore available which are capable of generating the required power level have literally been as big as a house. Smaller, transistorized sources are unable to generate the required power. This has prevented such laser devices from being utilized in airborne, most shipboard and other portable applications and has substantially increased the cost and complexity of such devices.

A need therefore exists for an improved high energy pulsed RF signal source which source is small and light enough to be adapted for use in airborne and other portable applications and in particular which is far smaller, lighter, simpler and less expensive than existing high energy RF pulsed sources.

SUMMARY OF THE INVENTION

In accordance with the above, this invention provides a method and apparatus for generating a high energy pulsed RF signal. A DC signal is initially generated and the power of this signal is increased to a predetermined level by compression. One or more transformers may also be provided to increase the voltage of the signal. The output from the compression is applied as a charging input to a multistage frozen wave generator. The charging is accomplished in a manner such that alternate ones of the stages of the frozen-wave generator are charged to a different level and/or polarity than the remaining stages. This objective may be accomplished by charging capacitor elements in each stage of the frozen-wave generator to a given level and polarity and then either reversing the polarity of the charge on the capacitor elements for the alternate stages or otherwise changing the level and/or polarity of the charges for these stages. Alternatively, the charging may be accomplished in a manner such that the capacitor elements for the alternate stages are charged to a different level and/or polarity than the capacitor elements for the remaining stages. The capacitor elements of the frozen-wave generator may, for example, be lumped capacitors or transmission line segments. Once the capacitor elements for all of the stages of the frozen-wave generator have been charged to the appropriate level and polarity, these charges are permitted to propagate through the generator to the final stage resulting in the desired high energy pulsed RF signal at the output from this stage.

The foregoing and other objects, features and advantages of the invention will be apparent from the following more particular description of preferred embodiments of the invention as illustrated in the accompanying drawings.

IN THE DRAWINGS

FIG. 1 is a semiblock schematic diagram of an RF power source in accordance with the teachings of this invention.

FIGS. 2A–D are diagrams illustrating the signals appearing at various points in the circuit of FIG. 1 during an operating cycle.

FIG. 3 is a schematic diagram of the frozen wave generator portion of a first alternative embodiment of the invention.

FIG. 4 is a schematic diagram of the frozen wave generator portion of a second alternative embodiment of the invention.

DETAILED DESCRIPTION

Figure 1:
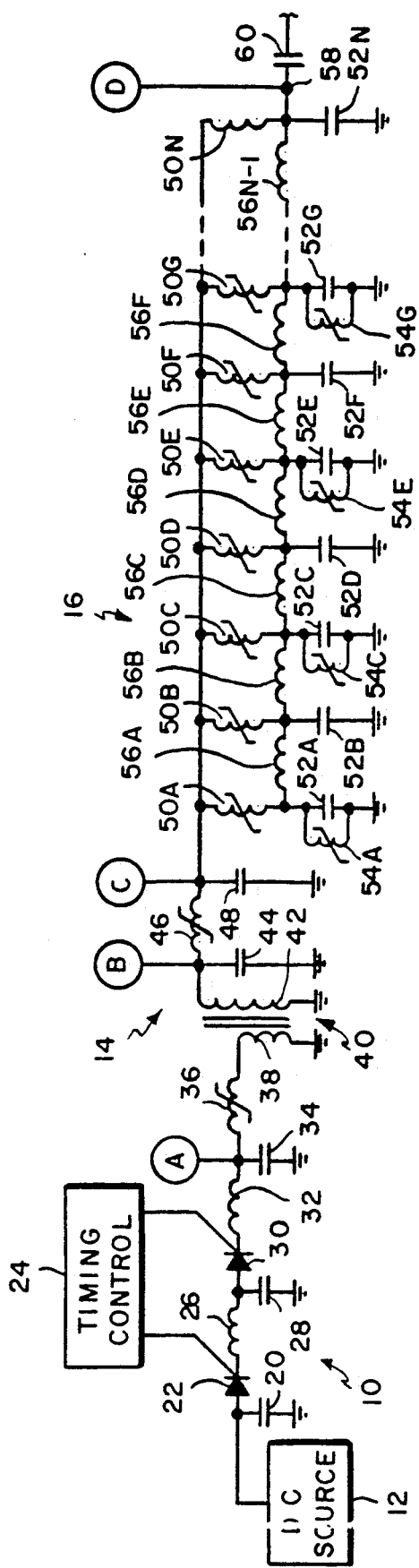

Referring to FIG. 1, it is seen that the RF pulse generator of this invention is formed of three major components, an SCR modulator 10 which converts a DC signal from source 12 into a pulsed signal to initiate an RF pulse generation cycle, a multistage nonlinear magnetic pulse compressor 14 which both compresses the pulse and amplifies its voltage and power and a multistage frozen wave generator 16 which is adapted to store the output from the compressor in each of its stages, to invert the value stored for alternate stages and to then serially output the stored high voltage high energy signals at RF frequency to provide the desired burst of RF pulse signals.

More particularly, the DC source 12 which may, for example, have a voltage output of 500 volts, is initially utilized to charge a large filter capacitor 20. Silicon controlled rectifier (SCR) 22 is normally open, preventing capacitor 20 from discharging. The operation of the circuit shown in FIG. 1 is initiated when a timing pulse from timing control 24 is applied to open SCR 22 permitting capacitor 20 to rapidly discharge through SCR 22 and coil 26 to charge capacitor 28. Capacitor 28 is a smaller capacitor than capacitor 20 and thus charges to a higher voltage.

When capacitor 28 is fully charged, timing control 24 generates a timing control signal to open normally closed SCR 30 permitting capacitor 28 to discharge through this SCR and through coil 32 to charge capacitor 34. While it might be possible to operate the SCR modulator portion of the circuit of FIG. 1 with only a single SCR stage rather than two stages as shown, SCRs have a relatively long recovery time after current stops flowing therethrough and it is possible that if a single SCR were utilized, the SCR might never open because of current drift. Two SCRs are therefore utilized to assure an open circuit in the modulator and to thus permit capacitor 20 to fully charge between cycles.

Capacitor 34 is the first stage of the magnetic pulse compressor 14. When this capacitor becomes fully charged, saturable core inductor 36 saturates permitting capacitor 34 to rapidly discharge through the primary winding 38 of transformer 40. The signal across capacitor 34, and thus the signal for the first stage of compressor 14, is shown on line A of FIG. 2. This signal increases as capacitor 34 charges over a time period of slightly over 3 microseconds and then rapidly discharges when saturable core inductor 36 saturates over a period of less than one half microsecond.

Transformer 40 is a voltage step-up transformer which is utilized to obtain the desired high voltage output. While in FIG. 1, a single voltage step-up transformer has been utilized which transformer is positioned between the first and second compression stages, this transformer may in fact be located between any two of the compression stages. Further, where sufficient voltage step-up cannot be obtained with a single transformer, two or more voltage step up transformers may be utilized. In such instances, the two or more voltage step-up transformers may all be between the same two compression stages or the transformers may be positioned between various ones of the compression stages in any desired combination.

Figure 2:
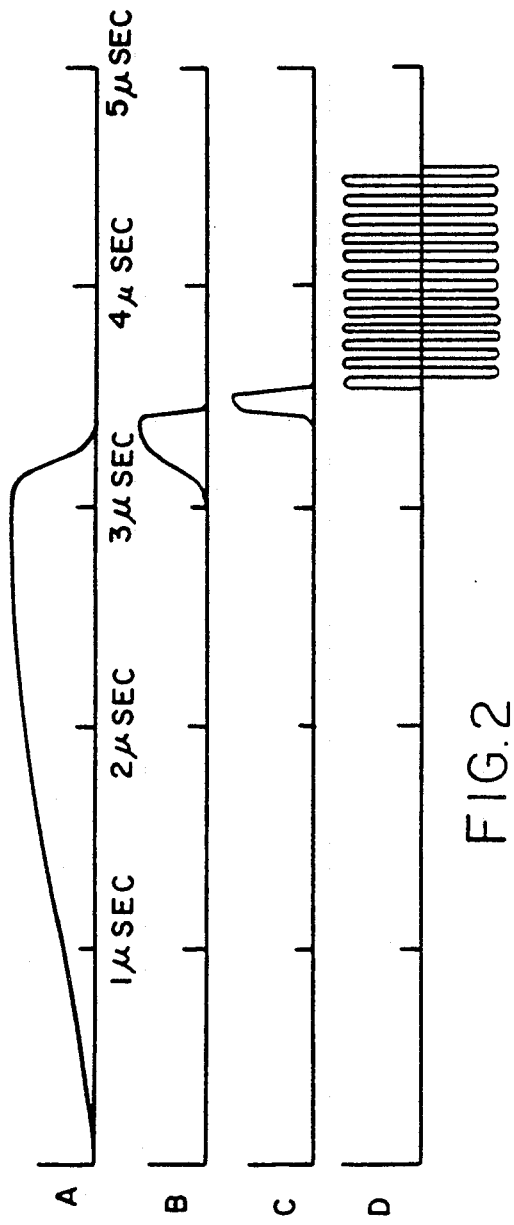

The stepped up voltage signal across the output winding 42 of transformer 40 is applied to charge capacitor 44 for the next stage of compression. When capacitor 44 is substantially fully charged, saturable core inductor 46 saturates permitting the charge on capacitor 44 to rapidly discharge to charge capacitor 48 of the next compression stage. By properly selecting the capacitors and saturable core inductors for succeeding stages, the capacitor for each succeeding stage will charge during a much shorter time than the time for the preceding stage (i.e., substantially during the discharge time for the preceding stage), causing the pulse times at the outputs from succeeding stages to be increasingly compressed. Since the power in the signal is substantially equal to the quotient of the energy or voltage divided by time, by compressing the pulses while transmitting substantially the same voltage from stage to stage, the power content of each pulse is substantially increased. This power increase, which is directly proportional to the compression ratio, would normally be less than 10 per stage and would typically be in the 5 to 6 range. The effect of compression is illustrated in FIG. 2 where line B shows the pulse level across capacitor 44 and line C shows the pulse level across capacitor 48. While three stages of compression are shown in FIG. 2 for the nonlinear magnetic compressor 14, additional stages can be provided if necessary to achieve a desired power level. Normally, three or four compression stages, in conjunction with a voltage step-up transformer 40, will provide the required increase in power.

When capacitor 48 is substantially fully charged, the saturable core inductors 50 for each stage of the frozen wave generator 16 saturate, permitting capacitor 48 to discharge in parallel through the saturable core inductors 50 to charge in parallel the lumped capacitor 52 of each stage. The voltage across each of these capacitors will be equal to the voltage across the capacitor 48 before discharge but, with compression, the power content will be increased.

Connected in parallel to alternate ones of the capacitors 52 is a saturable core inductor 54 which saturates when the corresponding capacitor 52 is fully charged. When inductor 54 saturates, it becomes a virtual short circuit across the capacitor forming a resonant tank circuit which causes the charge across the corresponding capacitor 52 to flip polarity. However, since the saturable core inductor 54 is a very high impedance in the opposite direction, once the charge flips, the charge across the corresponding capacitor 52 remains inverted. Thus, at the instant after charging of standing wave generator 16 has been completed, alternate ones of the capacitors 52 are charged to a particular voltage level and the remaining capacitors are charged to a voltage level which is the same as that of the other capacitors but of opposite polarity.

The standing wave stored in generator 16 then propagates through the generator at a frequency which is determined by the values of each capacitor 52 and inductor 56 ($f = 1/2\pi\sqrt{LC}$). Thus, by properly selecting the values of capacitors 52 and inductors 56, an RF pulsed output signal may be obtained at the output 58 from the standing wave generator, the output, as illustrated on line D of FIG. 2, being a succession of alternate positive and negative pulses as the outputs from the oppositely poled capacitors 52 propagate down the line. The number of pulses in each RF pulse output burst is determined by the number of stages N in the standing wave generator 16. A capacitor 60 is provided between output point 58 and the circuit output to filter out any DC component in the output from generator 16 so that only the high-power RF pulse burst appears at the circuit output.

The circuit shown in FIG. 1 is capable of producing RF pulse outputs having a power in the megawatt to gigawatt range, at RF frequencies which range from 10 to 100 megahertz and a repetition rate in the range of a few kilohertz. Such performance can be achieved with a circuit which is no larger than a lunch box rather than with the house-sized circuitry previously required. A high-powered RF pulse source suitable for portable applications is thus provided.

In the embodiment of the invention shown in FIG. 1, discrete capacitors 52 and inductors 56 have been utilized for the frozen wave generator 16. With such discrete components, the output RF pulses are in the form of a sine wave as shown on line D of FIG. 2.

FIG. 3 shows an alterative embodiment of the invention wherein the capacitors 52 have been replaced with short transmission line segments 70. The other difference in FIG. 3 is that the interstage inductors 56 have been replaced by interstage saturable core inductors 72.

The standing wave generator 16' of FIG. 3 operates in the same manner described for the generator 16 of FIG. 1 with all of the saturable cores 50 saturating when capacitor 48 is substantially fully charged causing charge to be applied in parallel to all of the transmission line segments 70. When the transmission line segments 70 become fully charged, the saturable cores 74 saturate causing a flipping of the charge in every other transmission line segment in the manner discussed in conjunction with the embodiment of FIG. 1. However, since each transmission segment 70 has a finite transmission length, there is a finite time involved in completing the flipping process. Since it is desired that discharge of the transmission lines to propagate the RF signal down the frozen wave generator not commence until the flipping operation has been completed, saturable core inductors 72 are provided which saturate at the same voltage level but at a slower rate than the saturable cores 74. Thus, the saturable cores 72 do not become fully saturated until the charge-flipping operation has been completed. Once the charge-flipping operation has been completed and cores 72 saturate, the saturable core inductors 72 function in the same manner described with respect to the inductors 56 in FIG. 1 to permit the propagation of the RF signal along the frozen wave generator 16' to the output.

One additional difference between the embodiments of FIG. 1 and FIG. 3 is that, whereas with discrete components, a sine wave is obtained as the RF output, a transmission line functions as a distributed capacitor, increasing the harmonic content of the output, and thus resulting in a square wave or substantially a square wave as the RF output. Similar results may be obtained by utilizing a number of capacitors 52 per stage, for example, four or more, rather than a single capacitor 52 per stage.

FIG. 4 shows another alternative embodiment for the frozen wave generator 16". For this embodiment, the single SCR modulator 10 and the single compressor 14 have been replaced by a positive SCR modulator and compressor 80 and a negative SCR modulator and compressor 82. The circuits 80 and 82 may be completely separate circuits or they may share components up to a certain point. For example, the circuits 80 and 82 may utilize the same components shown in FIG. 1 up to the transformer 40 with the transformer having two secondary windings, one of which is wound to have a positive output which is applied to subsequent compression stages and ultimately causes the charging of capacitor 84 and the other secondary winding being wound to have a negative output which is also applied through additional compression stages to ultimately charge capacitor 86.

When capacitor 84 is fully charged, saturable core inductors 88 saturate permitting capacitor 84 to discharge and rapidly charge alternate ones of the capacitors 52 (i.e., capacitors 52A, 52C, 52E . . . 52N −1). Similarly, when capacitor 86 is substantially fully charged, saturable core inductors 90 become fully saturated permitting capacitor 86 to discharge to charge the remaining capacitors 52 (i.e., capacitor 52B, 52D . . . 52N). By selecting all values in the circuit to be equal, capacitors 82 and 84 should become fully charged at the same time causing saturable core inductors 88 and 90 to saturate at the same time and causing the respective positive and negative charging of the capacitors 52 to occur simultaneously. If necessary, inductors 56 may be replaced by saturable core inductors such as the inductors 72 which are wound to have a predetermined saturation duration, thus delaying the discharge of the capacitors 52 to compensate for any slight variations in charging from the two different sources and assure that all capacitors are fully charged when discharge begins. Since alternate ones of the capacitors in the embodiment of FIG. 4 are charged to opposite polarities, there is no need for the parallel connected saturable inductors 54 in alternate stages to flip the charge on alternate capacitors.

Figure 5:
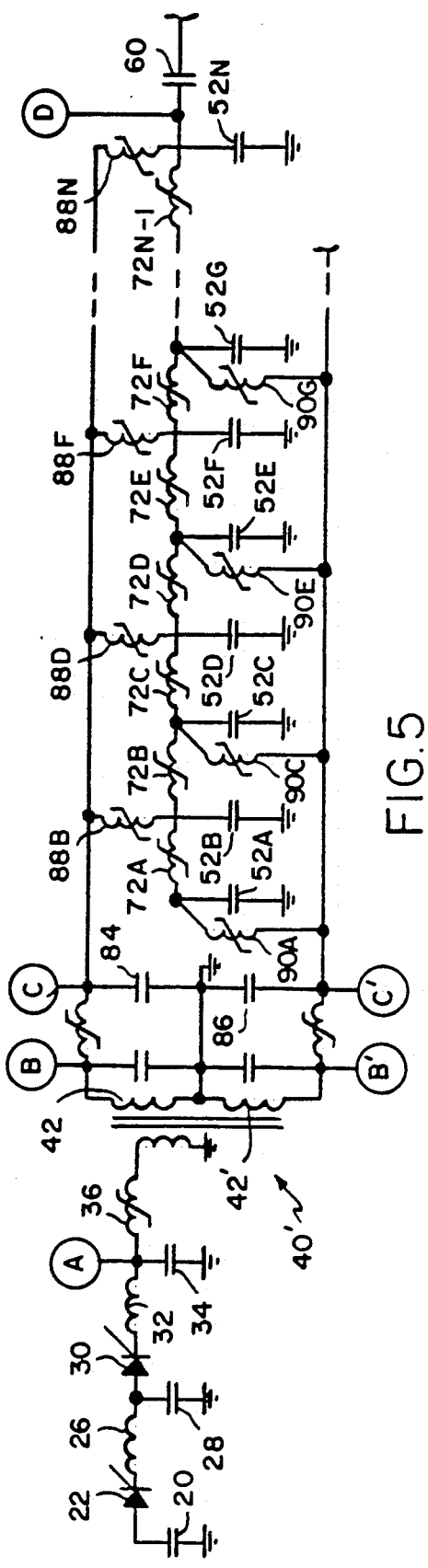
FIG. 5 is a more detailed schematic diagram of an embodiment of the invention of the type shown in FIG. 4.

FIG. 5 is a schematic diagram of a circuit of the type shown in FIG. 4 which incorporates some of the specific features indicated above. In particular, the two signals of opposite polarity to charge the frozen wave generator are obtained by providing two oppositely wound secondaries 42 and 42' on transformer 40 and saturable inductors 72 are provided between stages of the frozen wave generator rather than induction coils 56. The signals at the various points A–D in this circuit are the same as those shown in FIG. 2. In addition to the signal shown in FIG. 2, there would be pulses of opposite polarity at the points B' and C' from the pulses shown on lines B and C respectively of FIG. 2. Otherwise, the circuit shown in FIG. 5 operates in the same manner described above with respect to the circuits of FIGS. 1 and 4.

Further, while the embodiments of FIGS. 4 and 5 show the alternate charging scheme for the frozen wave generator being utilized with discrete capacitors, this technique could also be utilized to charge a frozen wave generator utilizing transmission line segments of the type shown in FIG. 3. Further, while in these figures two charge lines are shown which generate outputs of substantially equal voltage and energy and opposite polarity, this is not a limitation on the invention. For example, it might be possible to utilize the teachings of this invention having only the generator 80 charging capacitor 84 with the output of this capacitor being connected to charge alternate ones of the capacitors 52 as shown. With this configuration, when charging was completed, every other capacitor would have a positive charge with the capacitors in between having no charge. The resulting output would still be an RF pulse signal at the same frequency but with shorter swings than is obtained with the current configuration of FIG. 4. The outputs from capacitors 84 and 86 might also be of the same polarity but of different values or of different polarities and different values. In each instance, the output would be an RF pulsed signal, although the energy content of such signals would be different.

Similarly, rather than flipping the charge on the capacitive elements in the embodiments of FIGS. 1 and 3, the charges on such alternate capacitor elements could be discharged to ground through the saturated saturable core inductor or would merely not be charged at all.

In addition, while a separate saturable core inductor 50 (88 and 90 for the embodiment of FIG. 4) has been shown for each stage of the frozen wave generator 16, it is possible to design the circuits to use a single inductor 50 (or a single inductor 88 and a single inductor 90) for all stages.

Figure 6:
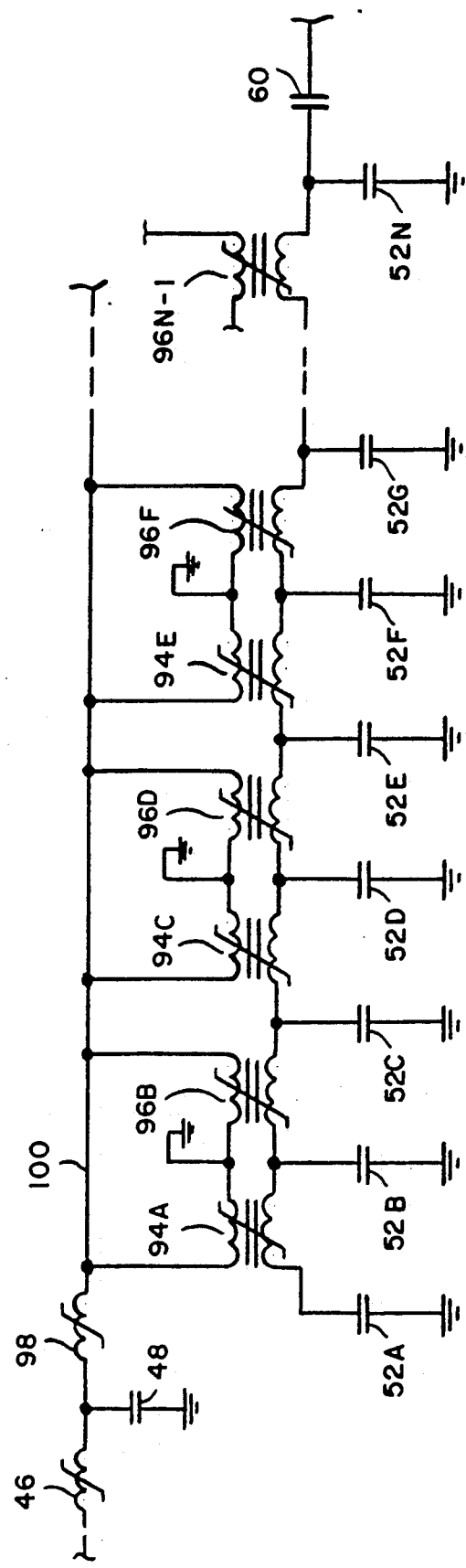
FIG. 6 is a schematic diagram of the frozen wave generator portion of a third alternative embodiment of the invention.

FIG. 6 illustrates still another embodiment of the invention wherein the alternative polarities are impressed on the line using saturable transformers. For this embodiment of the invention, the transformers 94 and 96 are initially unsaturated as is the saturable inductor 98. As with prior embodiments of the invention, when the capacitor 48 is fully charged, saturable core inductor 98 saturates permitting current to be applied to the transformers 94 and 96. Transformers 94 and 96 are wound in opposite directions. As a result, the signals induced in the secondaries of the transformers are operative to charge alternate ones of the capacitors to for example a positive potential and the remaining capacitors to a negative potential. The core material of the transformers is designed to saturate when the capacitors 52 have been fully charged. This decouples the charging line 100 from the capacitors 52. The secondary coils of the saturated transformers perform the same function as the saturated saturable core inductors 72 in prior embodiments. Thus, the capacitors 52 and saturated secondaries of the transformers 94 and 96 form a lumped element transmission line transmitting a sine wave signal at a selected RF frequency to the circuit output in the manner previously described.

The embodiment of FIG. 6 may also be modified in the manner described for previous embodiments by for example substituting transmission line segments 70 for lumped capacitors 52 and/or by having different number of windings for the transformers 94 and 96 so that the positive and negative swings of the RF output signal are not identical.

A compact, relatively inexpensive, easily portable high energy RF pulse generator is thus provided. While the invention has been particularly shown and described above with respect to preferred embodiments, the foregoing and other changes in form and detail may be made by one skilled in the art while still remaining within the spirit and scope of the invention.

What is claimed is:

1. A pulsed RF power source comprising:
   means for generating a DC pulse signal;
   means for compressing said DC pulse signal to increase its power to a predetermined level;
   a multistage frozen-wave generator, each stage of said generator having a capacitive element and an inductive element, the values of said elements determining the RF frequency of said source;
   means operative when the output from the compressing means reaches a predetermined level for rapidly charging the capacitive elements of said frozen-wave generator, said means including means for causing the charge on the capacitive elements for alternative ones of said stages to be different from the charge on the capacitive elements for the remaining stages;
   means, including said induction elements, for propagating the charges stored in the capacitors of said frozen-wave generator through said generator to the last stage thereof; and
   means for taking the RF output signal at the output from the last stage of the frozen-wave generator.

2. A source as claimed in claim 1 wherein said capacitive elements are lumped capacitors.

3. A source as claimed in claim 2 wherein said inductor elements are lumped inductors, the lumped inductors interconnecting the stages of said frozen wave generator.

4. A source as claimed in claim 2 wherein said means for causing the charge for alternate stages to be different includes means operative when the capacitors for said alternate stages are fully charged for reversing the polarity of said charge.

5. A source as claimed in claim 4 wherein said inductive elements are saturable core inductors, said saturable core inductors saturating when said capacitors are fully charged, the saturation time for said inductors being greater than the time required for the polarity on said capacitors to be reversed.

6. A source as claimed in claim 5 wherein said polarity reversing means includes a saturable inductor connected in parallel with the capacitor for each said alternate stage, said inductor saturating when the capacitor is fully charged to form a low impedance path through which the charge on the capacitator is reversed.

7. A source as claimed in claim 1 wherein the means for charging the capacitive elements includes saturable inductor means which saturates when the output from the means for compressing reaches said predetermined level, the capacitive elements being charged through said saturable inductor means.

8. A source as claimed in claim 7 wherein said saturable inductor means includes a separate saturable inductor through which each capacitive element is charged.

9. A source as claimed in claim 1 wherein said capacitive elements are transmission line segments.

10. A source as claimed in claim 9 wherein said induction elements interconnecting stages are saturable inductors, said inductors having a sufficient number of windings so that operation of said means for propagating is substantially delayed until all of said transmission line segments are charged to the desired value and polarity.

11. A source as claimed in claim 1 wherein said means for causing the charge for alternate stages to be different includes means operative when the capacitive elements for said alternate elements are fully charged for altering the level and/or polarity of said charge.

12. A source as claimed in claim 11 wherein said means for altering includes means for discharging the capacitive elements of said alternative stages.

13. A source as claimed in claim 1 wherein said means for causing the charge for alternate stages to be different includes means operative when the capacitive elements for said alternate stages are fully charged for reversing the polarity of said charge.

14. A source as claimed in claim 13 wherein said polarity reversing means includes a saturable inductor connected in parallel with the capacitive element for each said alternate stages, said inductor saturating when the capacitive element is fully charged to form a low impedance path through which the charge on the capacitive element is reversed.

15. A source as claimed in claim 1 wherein said means for charging the capacitive elements includes means for charging the capacitive elements of said remaining stages to a first level and polarity, and means for charging the capacitive elements of said alternative stages to a second level and polarity which level and/or polarity are different than said first level and polarity.

16. A source as claimed in claim 15 wherein the level for said first and second levels and polarities are substantially the same, but the polarities are opposite.

17. A source as claimed in claim 15 wherein said means for compressing includes first and second compressing means, one of said means for charging being responsive to the first compressing means and the other means for charging being responsive to the second compressing means.

18. A source as claimed in claim 15 wherein said means for compressing includes transformer means for stepping up the voltage of said DC pulse signal, said transformer means having first and second secondary windings which are wound to be oppositely poled; and
   wherein one of said means for charging is responsive to a signal on said first secondary winding and the other means for charging is responsive to a signal on the second secondary winding.

19. A source as claimed in claim 15 including first and second transformer means, each said transformer means having a primary and a secondary winding, said first and second transformer means being oppositely poled;
   wherein the output from said compressing means is applied to the primary windings of said first and second transformer means; and
   wherein the outputs at the secondary windings of said first transformer means are utilized for charging the capacitive elements of said remaining stages to said first level and polarity, and the outputs at the secondary windings of said second transformer means are utilized for charging the capacitive elements of said alternative stages to said second level and polarity.

20. A source as claimed in claim 19 wherein said secondary windings serve as the inductive elements of said frozen-wave generator.

21. A source as claimed in claim 20 wherein said transformers are saturable core transformers, said transformers saturating when the capacitive elements of said frozen wave generator are charged to a desired level.

22. A source as claimed in claim 1 wherein said means for compressing includes a multistage, nonlinear magnetic pulse compressor, each of said stages including a capacitor element and a saturable inductor adapted to saturate when the capacitor element charges to a predetermined level to permit the charge on the capacitor element to be passed to the next stage.

23. A source as claimed in claim 22 including at least one transformer between said DC signal generating means and said frozen wave generator for stepping up the voltage of the signal applied thereto.

24. A source as claimed in claim 1 wherein said DC pulse signal generating means includes a DC voltage source and an SCR modulator for converting said DC voltage to a DC pulse.

25. A method of generating a pulsed RF power signal comprising the steps of:

generating a DC pulse signal;

compressing said DC pulse signal to increase its power to a predetermined level;

utilizing the output of said compressing step to charge a multistage frozen-wave generator, said charging step including the step of causing the level and/or polarity of alternate stages of said generator to be different from the level and/or polarity of the remaining stages;

propagating the stored charges through the generator to the last stage thereof; and taking the RF output signal at the output from the last stage of the frozen-wave generator.

26. A method as claimed in claim 25 wherein said charging and causing steps including charging capacitive elements in all of said stages to the same level and polarity and then altering the level and/or polarity of the charge for said alternate stages.

27. A method as claimed in claim 25 wherein said charging and causing steps include the steps of charging capacitive elements of said remaining stages to a first level and polarity and charging capacitive elements of the alternate stages to a second level and polarity, where the second level and/or polarity are different from the first level and/or polarity.

* * * * *